(12) United States Patent
Chu

(10) Patent No.: US 8,276,655 B2
(45) Date of Patent: Oct. 2, 2012

(54) HEAT CONDUCTING APPARATUS

(75) Inventor: Chung-Jun Chu, Chung-Ho (TW)

(73) Assignee: Chemtron Research LLC, Dover, DE (US)

( * ) Notice: Subject to any disclaimer, the term of this patent is extended or adjusted under 35 U.S.C. 154(b) by 1041 days.

(21) Appl. No.: 12/200,128

(22) Filed: Aug. 28, 2008

(65) Prior Publication Data

US 2009/0101324 A1 Apr. 23, 2009

(30) Foreign Application Priority Data

Oct. 19, 2007 (TW) .............................. 96217594 U

(51) Int. Cl.
 *F28F 7/00* (2006.01)
 *H05K 7/20* (2006.01)
 *H01L 23/34* (2006.01)

(52) U.S. Cl. .................. 165/185; 361/704; 257/718

(58) Field of Classification Search ............... 165/185; 361/704; 257/718
See application file for complete search history.

(56) References Cited

U.S. PATENT DOCUMENTS

| | | | | |
|---|---|---|---|---|
| 6,419,008 B1 * | 7/2002 | Wu | ............................. | 165/80.3 |
| 6,587,344 B1 * | 7/2003 | Ross | ............................. | 361/704 |
| 6,643,133 B1 * | 11/2003 | Liu | ............................. | 361/704 |
| 6,868,899 B1 * | 3/2005 | White et al. | ................. | 165/185 |
| 6,934,153 B2 * | 8/2005 | Lee et al. | ..................... | 361/697 |
| 7,120,023 B2 * | 10/2006 | Whit et al. | .................... | 361/704 |

* cited by examiner

*Primary Examiner* — Frantz Jules
*Assistant Examiner* — Keith Raymond
(74) *Attorney, Agent, or Firm* — Turocy & Watson, LLP

(57) ABSTRACT

A heat conducting apparatus adopts a design of two oblique slide blocks disposed between and contacted with two objects for conducting heat from one of the two objects to another. The two oblique slide blocks can be adjusted freely according to the different heights of the two objects to conduct the heat produced by a heat generating component to a heat dissipating structure.

15 Claims, 4 Drawing Sheets

HEAT CONDUCTING APPARATUS

BACKGROUND OF THE INVENTION

1. Field of the Invention

The present invention generally relates to a heat conduction technology, and more particularly to a heat conducting apparatus in contact with two objects for conducting heat from one of the two objects to another.

2. Description of Prior Art

Heat dissipation is a major factor affecting the normal operation of a computer or a multimedia related device, and thus heat dissipation solutions play a substantially important role of fulfilling the increasingly higher demand of computer functions.

In addition to the basic requirement of dissipating heat produced by a heat generating source, computer manufacturers also tend to develop desktop or notebook computers with high heat dissipating efficiency. However, the design of desktop or notebook computers have to follow a specification, and thus heat dissipating structures or devices are installed at specific positions of a computer, and manufacturers need to provide solutions to improve the heat dissipating efficiency according to the various different specifications or internal structures of different models, and sometimes they have to make a redesign. For industrial computers, the position of installing a heat generating component in an industrial computer varies with different models and functions, manufacturers have to custom make different heat dissipating structures or devices, and even install a heat conducting structure between a heat generating source and a heat dissipating body to achieve a thermal conduction for dissipating the heat produced by the heat generating source to the outside. In the past, an object of such heat conducting structure was made of copper or aluminum and in a form of heat conducting block of a required size. The heat conducting block is in contact with the heat generating source and the heat dissipating body for conducting heat. However, after a single heat conducting block is produced as a finished good according to a specific interval, the produced heat conducting block cannot be used for other intervals. Furthermore, there is an unavoidable tolerance and even a manufacturing error occurred when a product is manufactured, a single heat conducting block cannot be adjusted to fit the actual size of the finished good. The heat conducting block cannot be used if the size of the heat conducting block is too large, or the heat conducting effect will be affected by a forming gap if the size of the heat conducting block is too small.

In view of the foregoing shortcomings of the prior art, the inventor of the present invention based on years of experience in the related industry to conduct extensive researches and experiments, and finally developed a heat conducting apparatus in accordance with the present invention to overcome the shortcomings of the prior art.

SUMMARY OF THE INVENTION

It is a primary objective of the invention to adopt a design of two slide blocks each with an oblique plane, and the two slide blocks are kept in contact with two objects such as a heat generating source and a heat dissipating body respectively for conducting the heat produced by the heat generating source to the heat dissipating body. In the design of the slide blocks, the height difference between the heat generating source and the heat dissipating body can be adjusted freely to comply with the design and provide a close contact between the heat generating source and the heat dissipating body for a good heat conducting effect.

To achieve the foregoing objective, the present invention provides a heat conducting apparatus in contact with two objects for dissipating heat, and the heat conducting apparatus comprises a base, a first heat conducting block and a second heat conducting block, wherein the base includes a containing space with an open top and an open bottom for installing a first heat conducting block, and the first heat conducting block has a first oblique plane facing the top of the base, and the second heat conducting block has a second oblique plane corresponding to the first oblique plane, and the second heat conducting block is stacked onto the top of the first heat conducting block. With a slide movement between the two oblique planes of the first and second heat conducting blocks, the interval between the two objects can be adjusted, so that the bottom of the first heat conducting block and the top of the second heat conducting block are in contact with the two objects respectively.

DETAILED DESCRIPTION OF THE INVENTION

The technical characteristics, features and advantages of the present invention will become apparent in the following detailed description of preferred embodiments with reference to the accompanying drawings, and the preferred embodiments are used for illustrating the present invention only, but not intended to limit the scope of the present invention.

Figure 1:
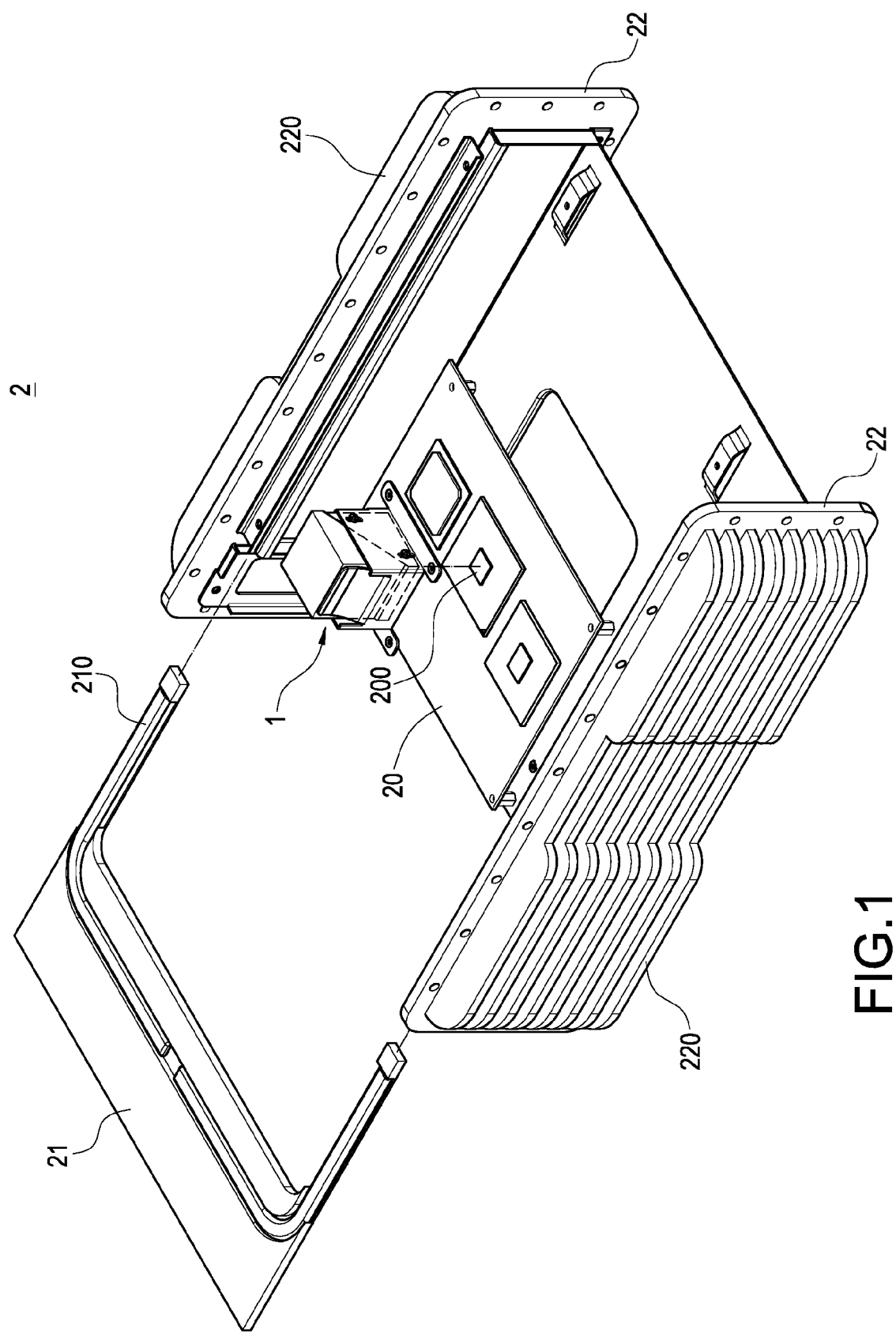
FIG. 1 is a perspective view of a heat dissipating apparatus applied to an industrial computer in accordance with the present invention.
Figure 2:
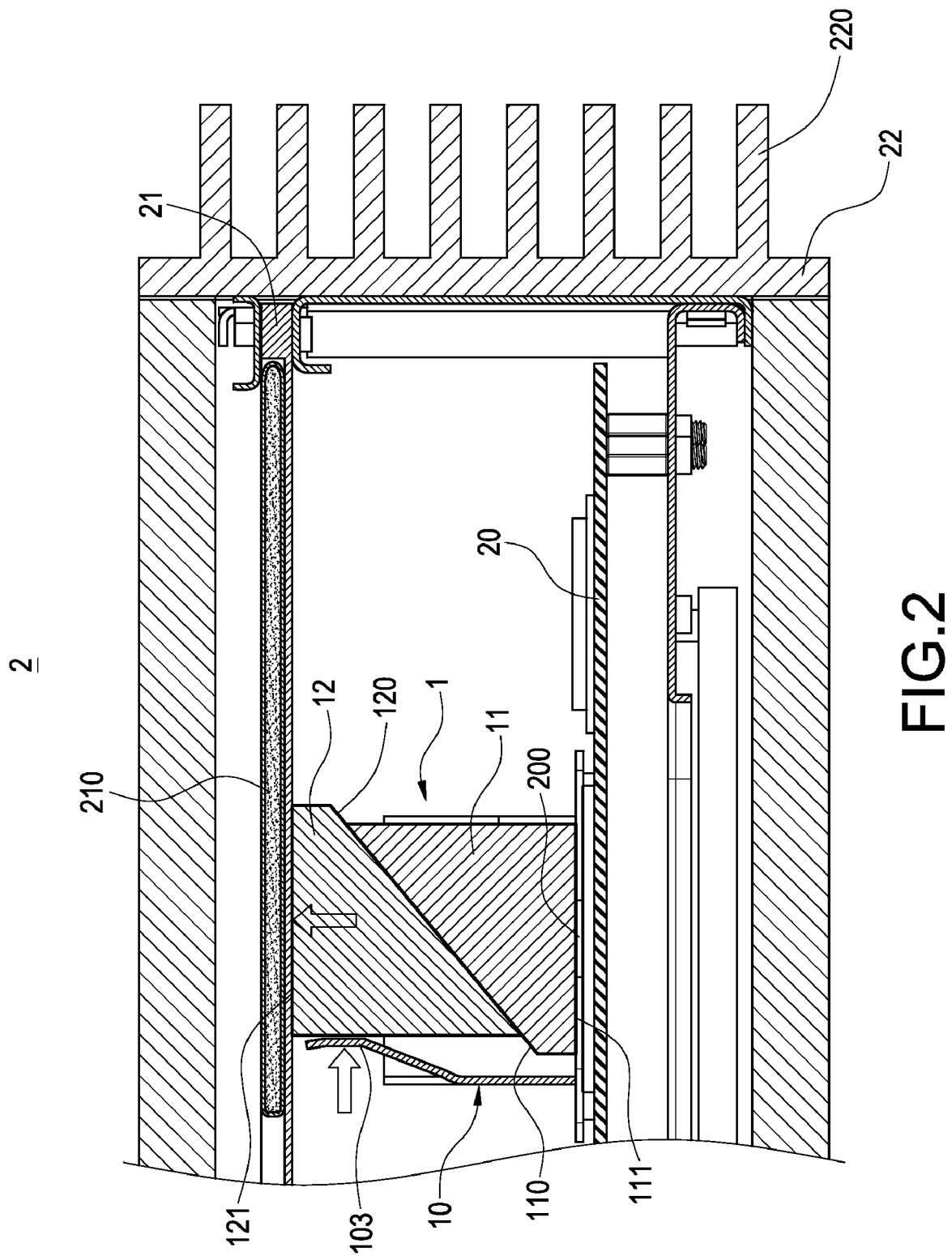
FIG. 2 is a partial cross-sectional view of a heat dissipating apparatus applied to an industrial computer in accordance with the present invention.

In FIGS. 1 and 2, the present invention provides a heat conducting apparatus 1 in contact with two objects such as a heat generating component 200 and a heat dissipating plate 21, and the heat conducting apparatus 1 conducts the heat produced by the heat generating component 200 to the heat dissipating plate 21 and dissipates the heat to the outside.

In a preferred embodiment of the present invention, the heat conducting apparatus 1 is installed in an industrial computer 2 (but not limited to the industrial computer 2 only). The industrial computer 2 contains a motherboard 20 therein, and the motherboard 20 comprises a heat generating component 200 and a heat dissipating plate 21 disposed in the industrial computer 2 and at a position corresponding to the top of the motherboard 20. The industrial computer 2 comprises: two heat dissipating covers 22, each of which is a portion of a casing of the industrial computer 2, exposed to the outside and disposed with a gap between each other, and made of a metal with a good heat dissipating effect; and a plurality of heat sink 220 disposed on an external lateral sides of the heat dissipating covers 22, such that a heat pipe 210 can be used for contacting and conducting the heat between the heat dissipating plate 21 and the heat dissipating cover 22 to dissipate the heat to the outside. The heat conducting apparatus 1 installed and coupled between the heat generating component 200 and the heat dissipating plate 21 conducts the heat produced by the heat generating component 200 to the heat dissipating plate 21 and then through the heat pipe 210 of the heat dissipating plate 21 for a quick thermal conduction, so as to conduct the heat to the two heat dissipating covers 22 through the heat pipe 210 and dissipate the heat to the outside.

Figure 3:
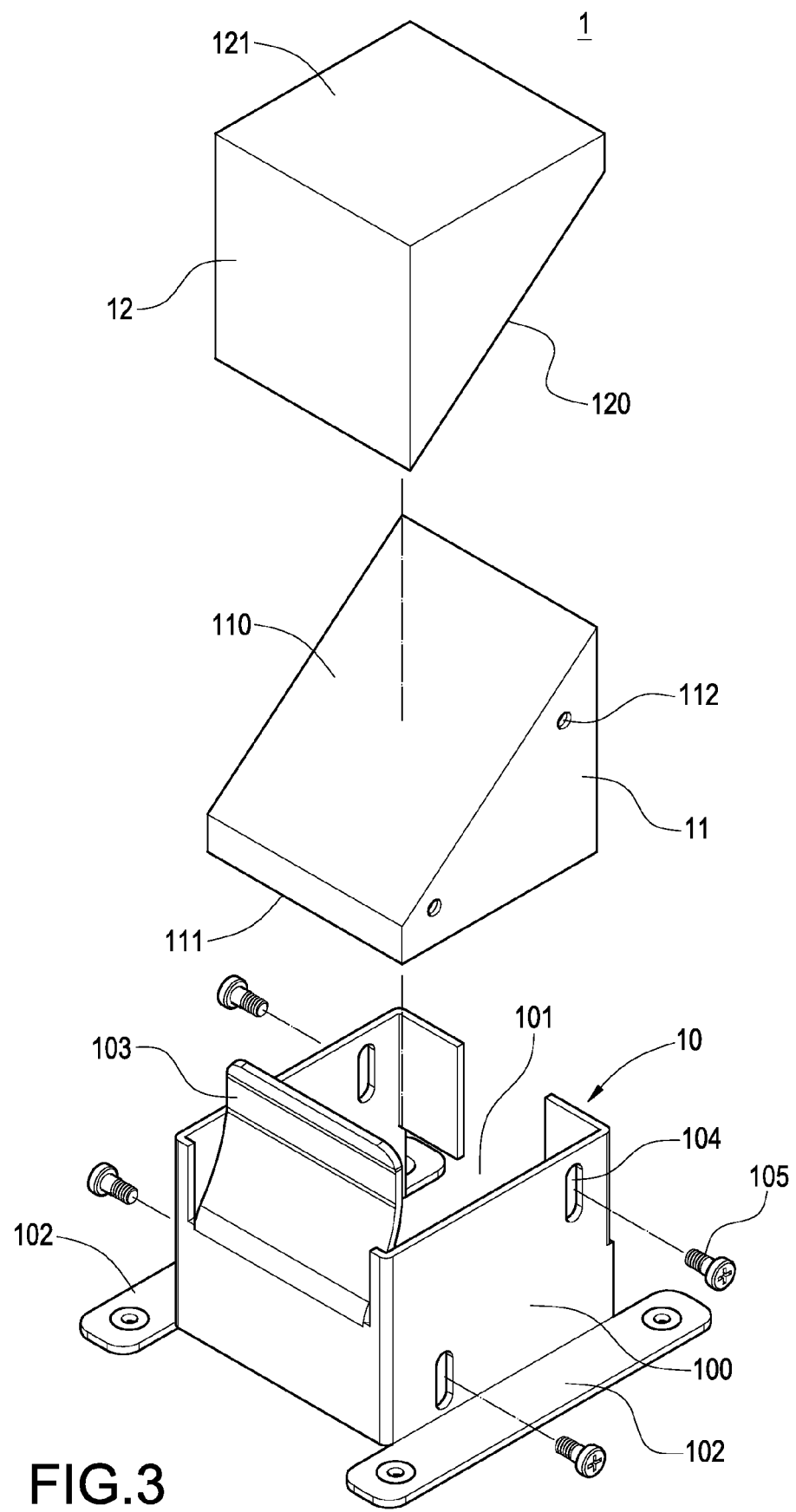
FIG. 3 is an exploded view of the present invention.
Figure 4:
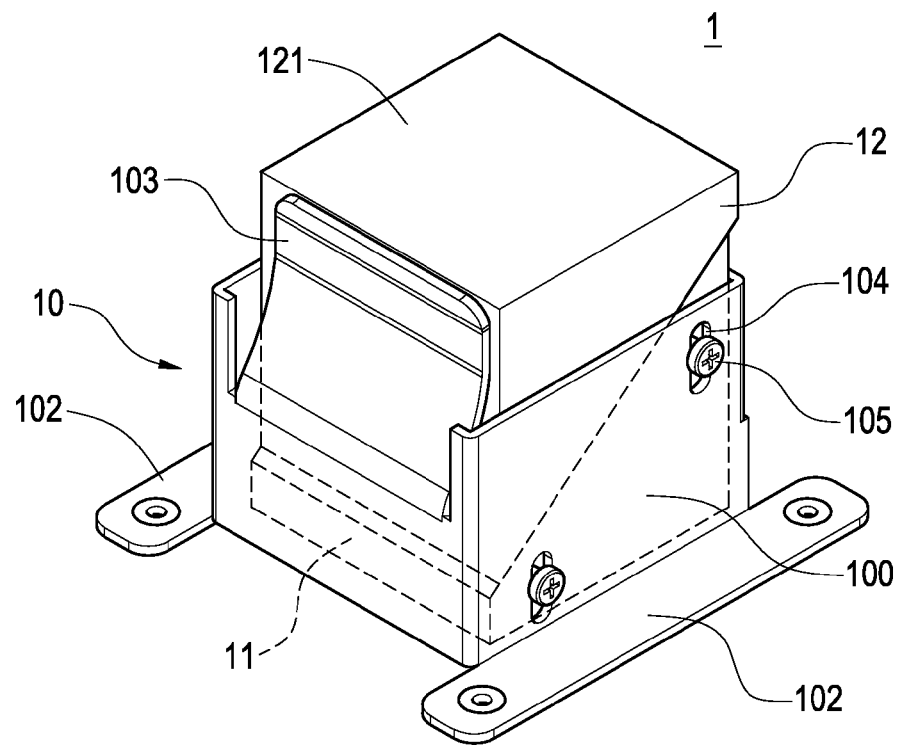
FIG. 4 is a perspective view of the present invention.

In FIGS. 3 and 4, the heat conducting apparatus 1 comprises a base 10, a first heat conducting block 11, and a second heat conducting block 12.

Figure 5:
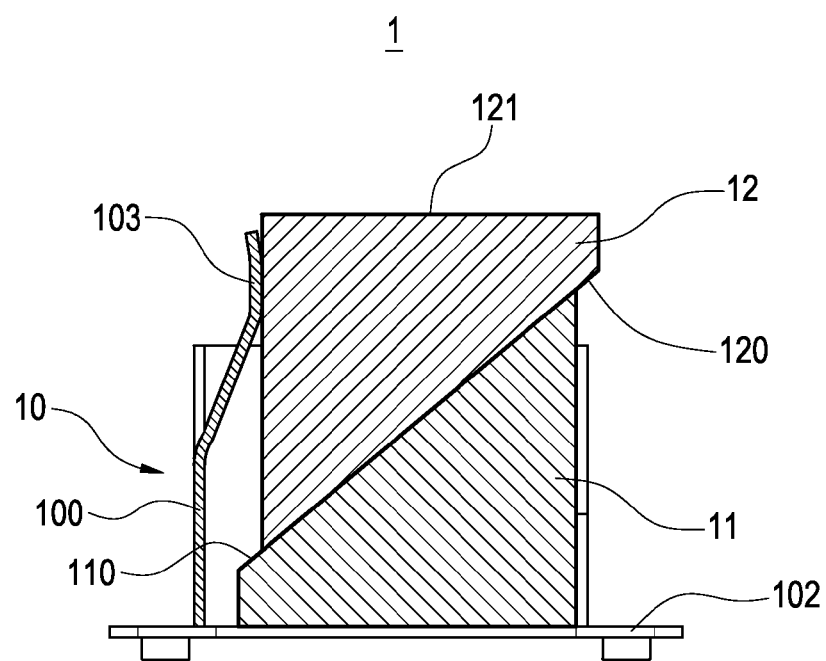
FIG. 5 is a cross-sectional view of the present invention.

The base 10 is provided for positioning the first and second heat conducting blocks 11, 12 to maintain a contact between the two heat conducting blocks 11, 12 as shown in FIG. 5. The base 10 is a frame made by a plurality of sidewalls 100, and a containing space 101 is formed in the base 10 for installing the first heat conducting block 11. The containing space 101 of the base 10 has an open top and an open bottom, such that the first heat conducting block 11 installed at the open top is corresponding to the second heat conducting block 12, and the open bottom is provided for contacting a desired object for conducting heat. The base 10 further includes a fixing portion 102 protruded horizontally towards an external side, and each fixing portion 102 is a plate object for installing and positioning the motherboard 2 to facilitate fixing the base 10 onto the motherboard 2 and at a position corresponding to the heat generating component 200.

The first heat conducting block 11 accommodated in the containing space 101 of the base 10 includes a first oblique plane 110 facing the top of the base 10, and the bottom of the first heat conducting block 11 is a plane 111 for attaching and contacting the heat generating component 200 to absorb the heat produced by the heat generating component 200. The lateral sides of the first heat conducting block 11 and each sidewall 100 of the base 10 include a plurality of locking holes 112, and the sidewalls 100 of the base 10 include a plurality of adjusting holes 104 corresponding to the plurality of locking holes 112, respectively, and each adjusting hole 104 is in a shape of a rectangular bar extending upward and downward for adjusting the height and position of the first heat conducting block 11 of the base 10 when the first heat conducting block 11 is installed to the base 10. After a fixing element 105 such as a bolt is passed through the adjusting hole 104 and secured into the locking hole 112, the first heat conducting block 11 is fixed into the containing space 101 of the base 10.

The second heat conducting block 12 stacked onto the top of the first heat conducting block 11 includes an oblique plane 110 of the first heat conducting block 11 corresponding to and in contact with the second oblique plane 120, and the second oblique plane 120 is disposed at the bottom of the second heat conducting block 12, and the top of the second heat conducting block 12 is a plane 121 for attaching and contacting the heat dissipating plate 21, such that the heat absorbed by the first heat conducting block 11 can be conducted to the heat dissipating plate 21.

In addition, the base 10 further includes a resilient plate 103 bent towards the resilient plate 103 and abutted at a lateral side of the second heat conducting block 12. The first and second oblique planes 110, 120 are inclined in the same direction and disposed on a sidewall 100 of the base 10 for providing a lateral pushing force to the second heat conducting block 12, so that the second heat conducting block 12 will not slide down along the first oblique plane 110, and can produce a pushing force upward.

With the foregoing structure, the heat conducting apparatus in accordance with the present invention is formed.

With reference to FIG. 2 again, if the heat dissipating plate 21 presses at the plane 121 of the second heat conducting block 12, two oblique planes 110, 120 between the first and second heat conducting blocks 11, 12 are slid to adjust the interval between the heat dissipating plate 21 and the heat generating component 200, such that the plane 111 of the first heat conducting block 11 and the plane 121 of the second heat conducting block 12 are in contact with the heat dissipating plate 21 and the heat generating component 200 respectively for conducting the heat produced by the heat generating component 200 to the heat dissipating plate 21. Since the first and second heat conducting blocks 11, 12 are kept in a close contact with each other by adjusting the two oblique planes 110, 120, a good heat conducting effecting can be maintained among the heat dissipating plate 21, the heat conducting apparatus 1 and the heat generating component 200. In addition, the second heat conducting block 12 presses onto the first heat conducting block 11, so that when the first heat conducting block 11 is in contact with a plurality of heat generating components 200, the contact between the two oblique planes 110, 120 of the first and second heat conducting blocks 11, 12 and the limit effect on the periphery of the first heat conducting block 11 provided by the base 10 can reduce the tolerance or gap existed between the first heat conducting block 11 and each heat generating component 200 to keep the first heat conducting block 11 in a close contact with each heat generating component 200.

In summation of the description above, the present invention improves over the prior art and complies with the patent application requirements and thus is duly filed for patent application.

While the invention is described in by way of examples and in terms of preferred embodiments, it is to be understood that the invention is not limited thereto. On the contrary, the aim is to cover all modifications, alternatives and equivalents falling within the spirit and scope of the invention as defined by the appended claims.

What is claimed is:

1. An apparatus, comprising:
   a base, including a containing space with an open top and an open bottom;
   a first heat conducting block disposed in the containing space, and comprising:
     a first oblique plane facing the open top of the base;
     a plurality of locking holes on a side of the first heat conducting block; and
     a plurality of adjusting holes on sidewalls of the base, wherein a plurality of fixing elements are disposed to pass into the plurality of adjusting holes and be received by the plurality of locking holes; and
   a second heat conducting block having a second oblique plane in contact with the first oblique plane and arranged on the first heat conducting block, wherein the first heat conducting block is located between the first oblique plane and a first object and the second heat conducting block is located between the second oblique plane and a second object, wherein the first heat conducting block and the second heat conducting block are adjustable in a direction substantially along the first oblique plane and the second oblique plane, and a bottom of the first heat conducting block and a top of the second heat conducting block are disposed to be in contact with the first object and the second object, respectively.

2. The apparatus of claim 1, wherein the base is a frame.

3. The apparatus of claim 1, wherein the base comprises a resilient plate bent towards the containing space and pressed against a lateral side of the second heat conducting block, and the first oblique plane and the second oblique plane are inclined in a same direction.

4. The apparatus of claim 1, wherein the base comprises a fixing portion protruded outward from a periphery of a bottom of the base, the fixing portion disposed to enable fixing the base to a third object.

5. The apparatus of claim 1, wherein one or more of the plurality of adjusting holes is in a shape of a rectangular bar extending upward and downward.

6. The apparatus of claim 1, wherein one or more of the plurality of fixing elements is a bolt.

7. The apparatus of claim 1, wherein the first object is a heat generating source.

8. The apparatus of claim 1, wherein the second object is a heat dissipating body.

9. The apparatus of claim 4, wherein the third object is a motherboard.

10. An apparatus, comprising:
    means for containing a space with an open top and an open bottom;
    first means for conducting heat disposed in the means for containing the space and comprising:
        a first oblique plane facing the open top of the means for containing the space;
        a plurality of means for locking, the plurality of means for locking being disposed on a side of the first means for conducting; and
        a plurality of means for adjusting disposed on means for dissipating heat, wherein a plurality of means for fixing are disposed to pass into the plurality of means for adjusting and reside in the plurality of means for locking; and
    second means for conducting heat having a second oblique plane in contact with the first oblique plane and stacked on the first means for conducting heat,
        the first means for conducting heat being located between the first oblique plane and a first object and the second means for conducting heat being located between the second oblique plane and a second object, wherein the first means for conducting heat and the second means for conducting heat are adjustable in a direction substantially along the first oblique plane and the second oblique plane, and a bottom of the first means for conducting heat and a top of the second means for conducting heat disposed to be in contact with the first object and the second object, respectively.

11. The apparatus of claim 10, wherein the means for containing the space includes a means for framing.

12. The apparatus of claim 10, wherein the first object includes a means for generating heat.

13. The apparatus of claim 10, wherein the second object includes the means for dissipating heat.

14. A system, comprising:
    a heat conducting apparatus, comprising:
        a base, including a containing space with an open top and an open bottom;
        a first heat conducting block disposed in the containing space, and comprising:
            a first oblique plane facing the open top of the base;
            a plurality of locking holes on a side of the first heat conducting block; and
            a plurality of adjusting holes on sidewalls of the base, wherein a plurality of fixing elements are disposed to pass into the plurality of adjusting holes and be received by the plurality of locking holes; and
        a second heat conducting block having a second oblique plane in contact with the first oblique plane and arranged on the first heat conducting block, wherein the first heat conducting block is located between the first oblique plane and a first object and the second heat conducting block is located between the second oblique plane and a second object, wherein the first heat conducting block and the second heat conducting block are adjustable in a direction substantially along the first oblique plane and the second oblique plane, and a bottom of the first heat conducting block and a top of the second heat conducting block are disposed to be in contact with the first object and the second object, respectively; and
    a heat generating source.

15. The system of claim 14, wherein the base further comprises a resilient plate bent towards the containing space and pressed against a lateral side of the second heat conducting block, and the first oblique plane and the second oblique plane are inclined in a same direction.

* * * * *